United States Patent
Kuhn

(10) Patent No.: US 9,051,771 B2
(45) Date of Patent: Jun. 9, 2015

(54) SUN PROTECTION DEVICE WITH ANGLE-SELECTIVE TRANSMISSION PROPERTIES

(75) Inventor: Tilmann Kuhn, Hinterzarten (DE)

(73) Assignee: Fraunhofer—Gesellschaft zur Förderung der angewandten Forschung e.V., Munich (DE)

( * ) Notice: Subject to any disclaimer, the term of this patent is extended or adjusted under 35 U.S.C. 154(b) by 891 days.

(21) Appl. No.: 12/308,989

(22) PCT Filed: Jun. 15, 2007

(86) PCT No.: PCT/DE2007/001064
§ 371 (c)(1),
(2), (4) Date: Jan. 28, 2009

(87) PCT Pub. No.: WO2008/003281
PCT Pub. Date: Jan. 10, 2008

(65) Prior Publication Data
US 2009/0199888 A1    Aug. 13, 2009

(30) Foreign Application Priority Data

Jul. 1, 2006 (DE) .......................... 10 2006 030 529
Mar. 20, 2007 (DE) .......................... 10 2007 013 331

(51) Int. Cl.
| | |
|---|---|
| *H01L 31/00* | (2006.01) |
| *E06B 9/24* | (2006.01) |
| *B32B 17/10* | (2006.01) |

(52) U.S. Cl.
CPC ........... *E06B 9/24* (2013.01); *Y10T 428/24322* (2015.01); *B32B 17/10036* (2013.01);
(Continued)

(58) Field of Classification Search
CPC . H01L 31/042; H01L 31/0422; H01L 31/048; H01L 31/0488; H01L 31/12; E06B 2009/2405; E06B 2009/2476; G02F 1/153; B32B 17/10036; B32B 17/1055

USPC .................................. 136/251, 255; 362/359
See application file for complete search history.

(56) References Cited

U.S. PATENT DOCUMENTS

| | | |
|---|---|---|
| 2,327,918 A | 8/1943 | Miller |
| 2,545,906 A | 3/1951 | Watkins |

(Continued)

FOREIGN PATENT DOCUMENTS

| | | |
|---|---|---|
| DE | 90 14 975.0 U1 | 1/1991 |
| DE | 196 11 060 A1 | 9/1997 |

(Continued)

OTHER PUBLICATIONS

Arai, JP10-299353, Machine Translation, Nov. 1998.*

(Continued)

*Primary Examiner* — Devina Pillay
(74) *Attorney, Agent, or Firm* — Breiner & Breiner, L.L.C.

(57) ABSTRACT

A sun protection device is described including at least one optically transparent dielectric layer, which on both sides is joined with a structural layer of an opaque or only partially translucent material. The two structural layers are structured subject to the formation of light passage openings and light-impermeable zones in such a manner that optical radiation incident on the outer structural layer under a predetermined angular range is blocked through interaction of the two structural layers and a proportion of optical radiation, which is incident on the second structural layer under a different angular range is able to pass the structural layers unhindered. The sun protection device makes possible an angle-selective transmission of sun radiation to achieve an anti-glare effect and at the same time allowing vision in a downward direction without moving parts.

32 Claims, 6 Drawing Sheets

(52) U.S. Cl.
CPC ..... *B32B17/10045* (2013.01); *B32B 17/10055* (2013.01); *B32B 17/10247* (2013.01); *B32B 17/10761* (2013.01); *E06B 2009/2405* (2013.01)

(56) References Cited

U.S. PATENT DOCUMENTS

| | | | |
|---|---|---|---|
| 3,453,039 A | | 7/1969 | Osborne |
| 5,059,254 A | * | 10/1991 | Yaba et al. .................... 136/251 |
| 5,370,913 A | * | 12/1994 | Lin ................................. 428/13 |
| 5,377,037 A | * | 12/1994 | Branz et al. ................... 359/265 |
| 6,055,089 A | * | 4/2000 | Schulz et al. ................. 359/270 |
| 6,467,935 B1 | * | 10/2002 | Schwab ........................ 362/354 |
| 6,612,091 B1 | * | 9/2003 | Glover et al. ................ 52/786.1 |
| 7,152,655 B2 | | 12/2006 | Clauss |
| 2002/0153038 A1 | * | 10/2002 | Umemoto et al. ............ 136/251 |

FOREIGN PATENT DOCUMENTS

| | | | | |
|---|---|---|---|---|
| DE | 101 39 583 A1 | | 2/2003 | |
| DE | 101 61 159 A1 | | 7/2003 | |
| EP | 0 170 472 A2 | | 2/1986 | |
| EP | 0 170 472 A3 | | 2/1986 | |
| JP | 10-299353 | * | 11/1998 | ............ H01L 31/042 |
| JP | 11-031834 | * | 2/1999 | ............ H01L 31/042 |
| JP | 2002-168062 A | * | 6/2002 | ................ E06B 5/00 |

OTHER PUBLICATIONS

JP11-031834 Machine Translation, Arai, Feb. 1999i.*
JP2002-168062A, Machine Translation, Nakatani, Jun. 2002.*

* cited by examiner

SUN PROTECTION DEVICE WITH ANGLE-SELECTIVE TRANSMISSION PROPERTIES

FIELD OF INVENTION

The present invention relates to a sun protection device, more preferably glazing, which comprises at least one first structural layer of an opaque or only partially translucent material on an optically transparent dielectric layer or layer sequence and a second structural layer of an opaque or only partially translucent material, wherein the first and the second structural layers are structured subject to the forming of light passage openings or zones and light impermeable or light-weakening zones.

In facade construction—more preferably in office buildings—the proportion of the glazed areas has been continuously increasing in recent years. In addition to the positive effect of greater daylight availability, this can however also result in overheating of the office rooms which is why adequate sun protection must be provided. On the one hand, this sun protection should at least partially allow vision to the outside and result in good room illumination, while offering adequate sun protection and avoiding glare.

BACKGROUND TO THE INVENTION

In addition to flexible, adjustable designs of sun protection devices such as louvers or textile roller blinds there also exist fixed or moveable hangings. For example DE 101 61 151 A1 and DE 101 39 583 A1 show sun protection devices which are constructed of a parallel arrangement of horizontal metal bars whose cross-sectional geometry is optimised with respect to the steering of the light. Through a gap between the bars through-vision is simultaneously made possible.

Composite glass panes are commercially available into which expanded metal with through-slots has been laminated. The through-slots are created through expanding deformation of a metal plate in which cuts have previously been made. Such a sun protection device is for example briefly mentioned also in U.S. Pat. No. 3,453,039 in connection with the FIGS. 3 and 4 of this publication, which deals with a sun protection device without through-openings.

Furthermore, glazings with sun protection function are commercially available which are coated with a screen print pattern or with a pattern of thin film solar cells, wherein between the zones with opaque or translucent print, air passage openings are present through which through-vision is possible. Such types of glazings however do not allow any angle-selective transmission of the sun radiation.

DE 196 11 061 A1 discloses a sun and glare protection device which offers the possibility of controlling the intensity of the incident light. This sun and glare protection device comprises two panes or plates which can be displaced relative to each other, each of which is provided with a structural layer of an optically non-transparent material on the side facing the other pane or plate, wherein the two structural layers are structured subject to the formation of light passage openings and light-impermeable zones. By displacing the two panes or plates the proportion of the area, at which a light passage opening is covered by the light impermeable area of the other pane, is continuously altered. In this manner the light passage can be set between a maximum and a minimum light passage. Via the width of the intermediate space between the two panes or structural layers filled with air the proportion of diffuse light relative to the directly incident light can be preselected.

SUMMARY OF THE INVENTION

The object of the present invention consists in stating a sun protection device which allows an angle-selective transmission of optical radiation, more preferably of incident sun radiation and manages to do so without moveable parts.

The object is solved with the sun protection device according to the claims. Advantageous forms of the sun protection device are the subject of the subclaims or can be taken from the following description and the exemplary embodiments.

The proposed sun protection device comprises at least one first structural layer of an optically opaque or only partially translucent material on an optically transparent dielectric, i.e. optically refracting layer or sequence of layers at least of approximately constant thickness and a second structural layer of an optically opaque or only partially translucent material, wherein the first and the second structural layers are structured subject to the formation of light passage openings or light passage zones and light-impermeable or light-weakening zones. An only partially translucent material in this case means a transparent or translucent material with which the structural layer in the selected layer thickness has a light transmission degree of ≤40%, preferentially ≤10% particularly preferred ≤3% for the incident radiation. This is achieved through the selection of a material which reflects and/or absorbs an adequate percentage of the incident radiation.

With the proposed sun protection device the second structural layer is in direct contact with the optically transparent layer or layer sequence on a side located opposite the first structural layer and joined with said the optically transparent layer or layer sequence. The two structural layers thus arranged firmly or statically relative to each other are structured in such a manner that optical radiation incident on the second structural layer in a predetermined angular range is blocked through the interaction of the two structural layers or at least suitably weakened—when using a only partially translucent material—and a part of optical radiation, which is incident on the second structural layer in a different angular range, is able to pass through the structural layers unhindered via the light passage openings or zones. Here, the angular ranges are defined in a reference plane which is located perpendicularly to the second structural layer, i.e. perpendicularly to the surface of the sun protection device directed to the side of the incident radiation. The second structural layer in this case constitutes the layer of the sun protection device which faces to the outside, i.e. towards the sunlight.

With the proposed sun protection device, sun protection, through-vision and—for most solar altitudes—also anti-glare effect can be achieved. The static sun protection device manages to get by completely without components that are moveable relative to one another. The angle-selective transmission is solely achieved through suitable dimensioning of the two structural layers in interaction with the light-refracting layer or layer sequence located in-between, with which the structural layers are joined. Only through this light-refracting medium between the two structural layers can an unhindered anti-glare effect for sun radiation with unhindered vision in a downward direction can be achieved at the same time via the dimensioning of the structural layers.

In the simplest form the sun protection device is composed of the optically transparent layer or layer sequence with the structural layers applied on both sides. The transparent layer or layer sequence in this case as well as with all following forms, can be formed by a pane of transparent glass or plastic material (for example acrylic glass or polycarbonate). The structures of the two structural layers form a stripe pattern of parallel strips of the opaque or only partially translucent material. The structures of the two structural layers in this case have the same periodicity. They can for example be applied with a screen printing technique. The utilisation of adhesive strips is also possible, in which case strips of metal or plastic are preferably employed. For the improved application of adhesive strips these can be interconnected in certain locations via thin ligaments so that the distance of the strips during the process of application or affixing is adequately fixed.

In a particularly preferred form of the proposed sun protection device the light-impermeable zones of at least the second structural layer are formed through photovoltaic solar cells. Amorphous solar cells are particularly suitable for this. If the light-impermeable zones of the first structural layer are also formed through solar cells, a similarly high efficiency with respect to direct sun radiation can be achieved highly advantageously with the solar cells as with an individual pane 100% covered with solar cells, since the direct sun with appropriate dimensioning of the layer structures is able to shine through the layer structures of the proposed sun protection device only with very low solar altitudes.

In principle, the strips of the first and the second structural layer can consist of different material, for example those of the second structural layer of amorphous solar cells and those of the first structural layer of a material applied by means of screen print or vice versa. The strips can have different colours on the inside and outside, wherein outside designates the side in the intended usage of the sun protection device directed towards the radiation, for example the outside of a facade element or window and inside, the side facing away from the radiation, i.e. for example the inside of a facade element or window. Various colours can be achieved for example when applying the layered structures by means of screen print, through double print. To do so, the colour visible from the one side is first printed on and then the colour visible from the back on top. The technique of double print is known and already employed with screen print colours. With the intended use of the proposed sun protection device it is practical, if the screen print is highly reflective to the outside for the sake of sun protection, for example white, and, to the inside, for the sake of anti-glare effect, darker for example, light grey. Through double print a facade covered with the sun protection device can be embodied in any way to the outside without disturbing the user. In the exemplary case the inside of the outer (second) structural layer would be indirectly illuminated through a white outside of the first structural layer. This has a positive effect on the daylight supply for an interior room if the back of the outer structural layer is not embodied too dark. A compromise between anti-glare effect/through-vision (=dark back and daylight supply=light back) can be found.

In a further development of the proposed sun protection device, more preferably when using amorphous solar cells in the second structural layer, the second structural layer is joined with a second optically transparent layer or layer sequence on the side opposite the optically transparent layer or layer sequence. This second optically transparent layer or layer sequence, too, is preferentially a glass or plastic pane. In this case the structures or strips of the second structural layer can then be applied to this second transparent layer or layer sequence during the manufacture, for example by means of screen print, before the connection with the first transparent layer or layer sequence takes place. The entire construction is preferentially realised as composite glass pane, wherein the two glass or plastic panes are joined via an adhesive film (e.g. PVB film) located in-between. The adhesive film in this case should have a refractory index which is close to the refractory index of the glass or plastic material of the two panes used, in order to prevent additional greater refractory effects for the optical radiation. Obviously the use of other joining techniques is also possible, for example by using a viscous adhesive.

With the proposed sun protection device, further optically transparent layers or layer sequences can also be applied to the inside, i.e. on the side of the first structural layer which is still free. Here, the use of layers with certain colour is also possible in order to take into account aesthetic requirements. This inner layer or layer sequence in the present patent application designated as third layer or layer sequence, has no further shading function. It can likewise be formed of a glass or plastic pane, with additional coating if applicable. In this case the sun protection device is preferentially realised as a composite glass pane with three glass or plastic panes which are joined with one another via adhesive film and between which the structural layers are located.

The embodiment of the proposed sun protection device as insulating glazing or as multiple glazing (e.g. double glazing or triple glazing) is also possible. In the case of the double glazing, the component constructed of the two structural layers and the one or a plurality of optically transparent layers or layer sequences preferentially forms the outer pane of the double glazing. Utilisation as an inner pane—or in the case of more than two panes—as intermediate pane is obviously possible as well. Between this outer glazing element and an inner glazing element, a glass or plastic pane, an intermediate space filled with gas or a gas mixture is present, which preferentially is hermetically sealed. In the known manner, air, argon or crypton for example can be considered as gas or gas mixture. The side of the outer glazing element adjoining this intermediate space or the side of the inner glazing element adjoining this intermediate space can additionally be coated for example with a heat protection coating (e.g. Low-E soft coating).

The proposed sun protection device can generally be employed as glazing element for all facade zones which are to be glazed. Preferably the sun protection device is employed in zones which do not immediately serve for outward vision. Furthermore, obvious fields of application are more preferably balustrade regions of glass facades or balcony balustrades as well as in residential and non-residential construction. By using thin film solar cells for the light-impermeable zones of the structural layers, optimisation of the characteristics of glazings with thin film solar cells is achieved.

The solar protection device can be manufactured using the usual manufacturing technologies of window and facade construction in form of an individual pane consisting of one or a plurality of the transparent layers or as insulating or multiple glazing.

The strips of the two structural layers with the proposed sun protection device are dimensioned so that when using this sun protection device, incident sunlight from above is blocked through the light-impermeable or only partially translucent strips of the two structural layers or at least weakened by $\geq 60\%$, preferentially by $\geq 90\%$, particularly preferred by $\geq 97\%$, while the direct vision in a downward direction continues to be ensured. The light-impermeable or only partially translucent zones of the second structural layer in total take up a smaller area on the optically transparent layer or layer sequence than the light-impermeable or only partially translucent zones of the first structural layer. Through the width, the distance and the mutual offset of the strips of the two structural layer, the angular ranges of the incident sun radiation can be determined which do not pass through the sun protection device or at least greatly weakened so and the angular ranges set in which a part of the radiation can pass through the sun protection device unhindered. The four degrees of freedom for the geometry of these structural layers can be stated through specifying ranges for four angles, $\alpha$, $\beta$, $\gamma$ and $\sigma$ as is explained in more detail in the following exemplary embodiments. The angular ranges refer to the reference plane and are stated relative to the surface normal to the layers of the sun protection device.

When using the sun protection device the suitable dimensioning and orientation of the strips also depends on the orientation of the sun protection device and the side of the building on which the sun protection device is used. In the case of vertical facades, i.e. with vertical installation of the sun protection device, the surface normal of the sun protection device also constitutes the horizontal, relative to which the substantial profile angle of the sun is defined. With facades that are not vertically upright, i.e. inclined facades, a deviation brought about by the inclination is obtained, but which the person skilled in the art is able to easily take into account with the dimensioning of the present sun protection device.

For optimum protective action the strips when using the sun protection device can also run at an incline to the horizontal, when the surface normal of the sun protection device or facade is not exactly orientated in the direction of south. On a vertical south facade the strips are therefore preferentially orientated horizontally, while on facades not orientated to the south, they are turned from the horizontal with a corresponding degree.

In an embodiment of the sun protection device, wherein the first and/or second structural layer is formed from an only partially translucent material, a dark, substantially clearly transparent material is preferentially selected which has a directed diffuse transmission degree which amounts to less than 20% of the entire transmission degree of the material. An example for this is a film material with a total transmission degree of 2%. In this manner, adequate anti-glare effect with simultaneously low vision in the direction toward the top can still be achieved in many cases.

In a further embodiment a material which can be switched in the transmission degree is employed for the first and/or second structural layer, for example an electrochromic or gaseochromic material. With such a material the transmission degree can be controlled in a wide range, for example in the range between 1% and 70%.

BRIEF DESCRIPTION OF THE DRAWINGS

The proposed sun protection device is again explained in the following in more details by means of exemplary embodiments in connection with the drawings. Here it shows.

DETAILED DESCRIPTION OF THE INVENTION

Figure 1:
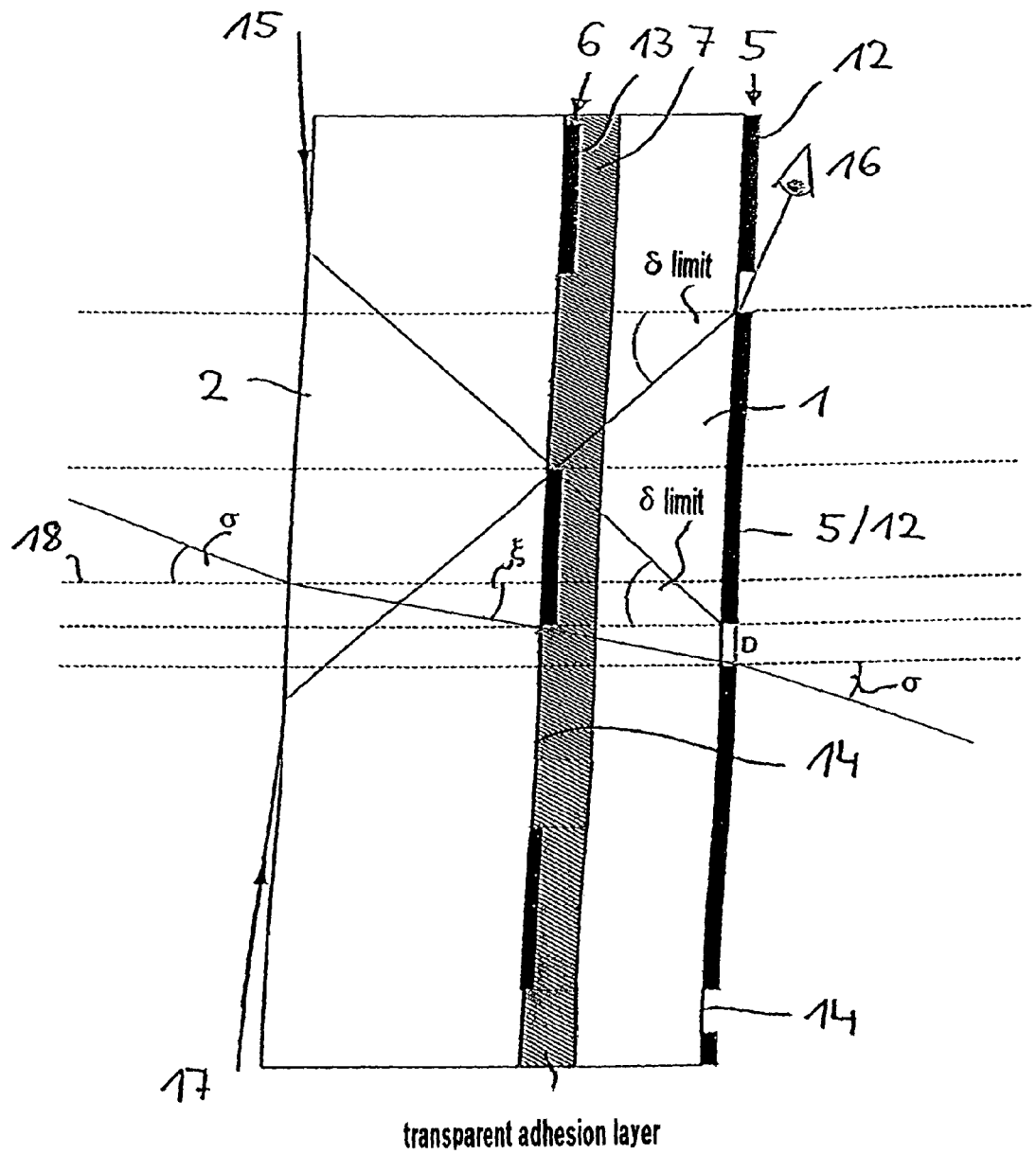
FIG. 1 a first example of an embodiment of the sun protection device.

In a detail FIG. 1 shows a sectional representation of an exemplary sun protection device according to the present invention as it can be employed as glazing or facade element. With this example a vertical facade was assumed on which the sun protection device is attached.

The sun protection device in this example comprises a first optically transparent layer sequence of a glass pane 1 and an adhesive film 7. The glass pane 1 on the inside is joined with a first structural layer 5 and on the outside via the adhesive film 7 with a second structural layer 6. On the second structural layer 6 is arranged a second transparent layer 2 which forms the outside of the sun protection device and for example can likewise be a glass pane. The second structural layer 6 embedded in the sun protection device is composed of a strip pattern of light-impermeable strips 13 between which light passage openings 14 likewise orientated in parallel are formed. The first structural layer 5, which forms the inside of the sun protection device, is also composed of corresponding strips 12 and light passage openings 14.

The figure in each case shows only the width of the strips 12, 13, while the strips extend in a direction that is vertical to the drawing plane.

When dimensioning the strips 12, 13 of the two structural layers 5, 6 of the sun protection device, light 15 which is incident from the top cannot enter the interior space through the sun protection device, even if it is grazing incidence. This is hinted by means of the beam orientation shown in FIG. 1. An observer 16 nevertheless has completely unhindered vision through the sun protection device from the horizontal as far as the bottom from the inside, as is likewise indicated in the FIG. 1. Light 17 which is incident quasi in strip form is orientated in the optically transparent material of the sun protection device under the limit angle of the total reflection $\sigma_{limit}$. A very elevated sun can thus not shine directly in the interior with this embodiment because the light would run flatter through the optically transparent material than $\sigma_{limit}$. In the case of glass panes (n≈1.55) produces a limit angle of the total reflection of 40-42°. On the other side a light beam incident under the angle $\sigma$ relative to the surface normal 18 can just pass without any obstruction. This corresponds to a sun that is already positioned very low. The surface normal 18 with this embodiment also corresponds to the horizontal. However, this is not the case with vertically orientated facades or non-vertical arrangement of the sun protection device (refer for example FIG. 6).

Figure 2:
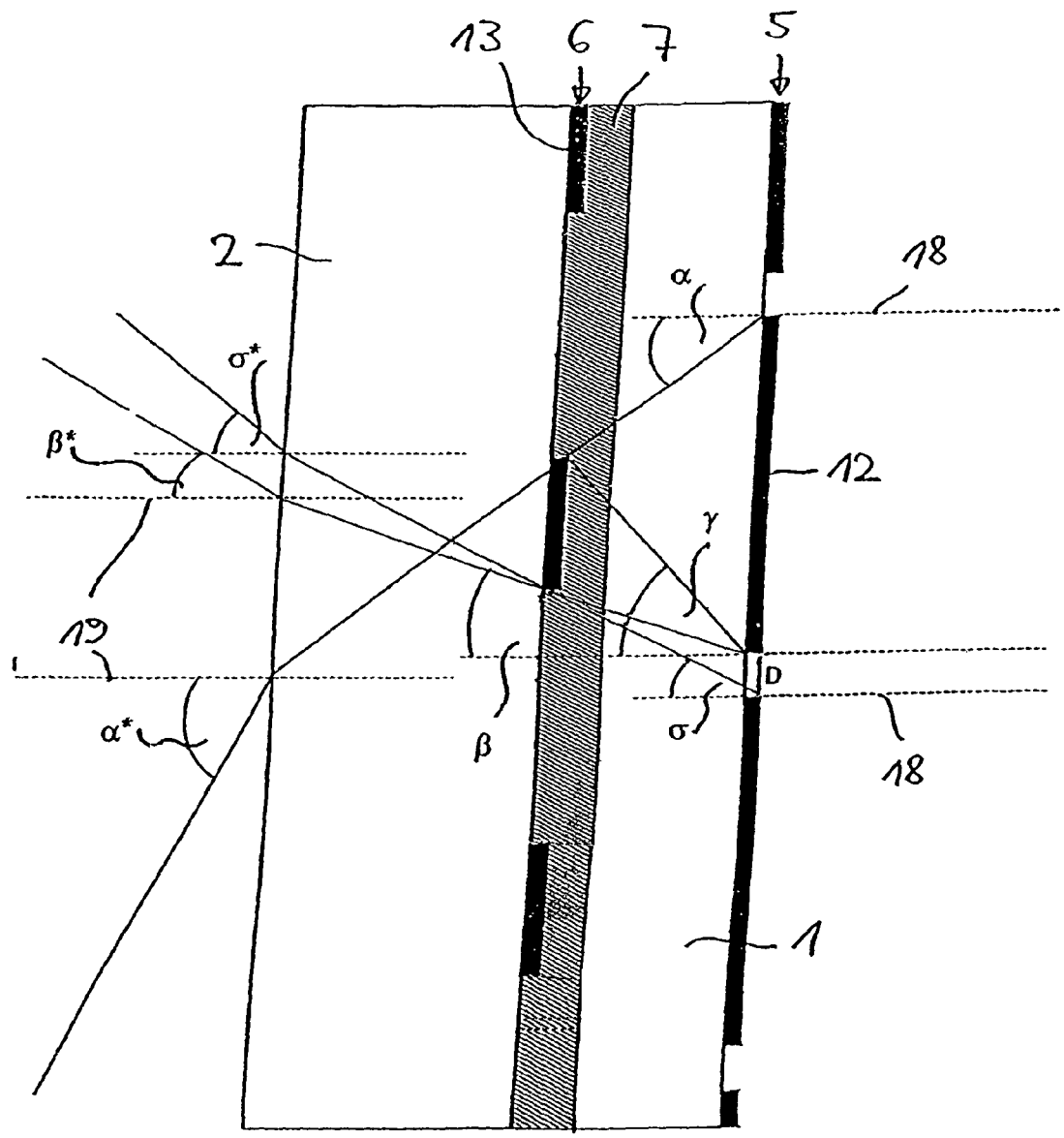
FIG. 2 the example of FIG. 1 with general angular data.

FIG. 2 therefore shows the angles relevant to the embodiment of the sun protection device in a general form. The construction of the sun protection device in FIG. 2 is identical to the construction of the sun protection device of FIG. 1, wherein as adhesive film 7 PVB with a refractory index of N=1.5 is used. From a certain profile angle $\sigma_p$ the sun is to be faded out. In the present example a south facade is assumed here, where the strips 12, 13 of the structural layers 5, 6 run horizontally. In the representation of FIG. 2 the horizontal 19 is drawn parallel to the surface normal 18 only exemplarily.

The angles $\alpha^*$, $\beta^*$ and $\sigma^*$ are measured against the horizontal 19, not against the surface normal 18 of the facade or sun protection device. The angles $\alpha$, $\beta$, $\gamma$ and $\sigma$ are defined relative to the surface normal 18. With inclined facades (e.g. roof glazing) the surface normal 18 and the horizontal 19 do not correspond. All angles refer to a reference plane which is orientated vertically to the layer planes of the individual layers or to the surface of the sun protection device, in the present examples the drawing or sheet plane. In the case of sun radiation not incident in this reference plane the angular data applies to the projection of the radiation factor in the reference plane (profile angle).

The four angles $\alpha$, $\beta$, $\gamma$ and $\sigma$ are each defined relative to the surface normal 18 of the sun protection device. The angles $\alpha$ and $\gamma$ specify the position of the upper edge of the respective strip of the second structural layer 6 relative to the two strip edges of the strip of the first structural layer 5 that happens to be positioned closest. The angle $\beta$ defines the inclination of the connecting line between the lower edges of the nearest-positioned strips of the first 5 and second structural layer 6, the angle $\alpha$ the inclination of the connecting line between the lower edge of the strips of the second structural layer 6 and the upper edge of the strip of the first structural layer (5) that happens to be positioned below (compare FIG. 2).

The angles $\alpha^*$, $\beta^*$ $\gamma^*$ and $\sigma^*$ are obtained with the help of the refraction law from the angles $\alpha$, $\beta$ $\gamma$ and $\sigma$ (or vice versa) in the following general form:

$$\sin(\xi^*)/\sin(\xi) = n_{Material}/n_{Surroundings}$$

Here it was assumed that the refraction index of the adhesive layer 7 corresponds very well with the refraction index of the glass. If this is not the case, the further refractions on the interfaces must be taken into account. However, this is possible with the refraction law in an easy manner. In the case of microstructures, i.e. microstrips, the refraction law does not apply per se because of the diffraction manifestations. However, the structures proposed here can still be employed. In this case the limit angle $\sigma_{limit}$ of the total reflection then has to be assumed somewhat greater than would be obtained from the geometrical optics, so that adequate fading-out of the sun radiation is nevertheless guaranteed.

The angle $\beta^*$ indicates from which angle the sun can pass through the sun protection device through grazing incidence on the strips of the layer structures.

The angle $\beta$ should be set so that based on the refractory law the following angles are obtained for $\beta^*$: $-20° \leq \beta^* \leq 20°$ particularly preferably $-10° \leq \beta^* \leq 0°$. Versions with $60° > |\beta^*| > 20°$ are likewise possible. However, these are degraded embodiments. The angular data for $\beta^*$ apply irrespective of the inclination of the facade. They are solely derived from the possible solar positions.

The angle $\alpha$ should be set so that based on the refraction law the following ranges for $\alpha^*$ are obtained: $-20° \leq \alpha^* \leq 90°$, preferably $0° \leq \alpha^* \leq 90°$, particularly preferred $45° \leq \alpha^* \leq 90°$, $\alpha$ is then automatically smaller than $\sigma_{limit}$. Optimally $\alpha^*$ is at 90°, i.e. $\alpha = \sigma_{limit}$.

For the angle $\gamma$ preferentially the following ranges are selected: $-30° \leq \gamma \leq 80°$, preferably $\sigma_{limit} \leq \gamma \leq 80°$, particularly preferred $\sigma_{limit} \leq \gamma \leq \sigma_{limit} + 20°$. In the optimal case $\gamma$ coincides with $\sigma_{limit}$.

Versions, wherein $\alpha$ is greater than $\sigma_{limit}$, are degraded embodiments because the gap or slots of the first structural layer then have to be located further down so that no light is able to shine through from above. This results in a smaller area proportion of the free area on the inside and thus brings about a poorer transparency. Versions, wherein $\gamma$ is smaller than $\sigma_{limit}$, are likewise degraded embodiments since the sun is able to shine through the element from above.

The distance D of the structural elements or strips of the first layer structure should be selected independently of the inclination of the facade so that the direct sun from a profile angle $\sigma_p$ of $-20° \leq \sigma_p = \sigma^* \leq 70°$, preferably $0° \leq \sigma_p = \sigma^* \leq 45°$, particularly preferably $5° \leq \sigma_p = \sigma^* \geq 25°$ is faded out. Like the dimensioning on the basis of the angles $\alpha^*$, $\beta^*$ and $\gamma^*$ this requires the knowledge of the inclination of the facade on which the sun protection device is to be employed.

Figure 3:
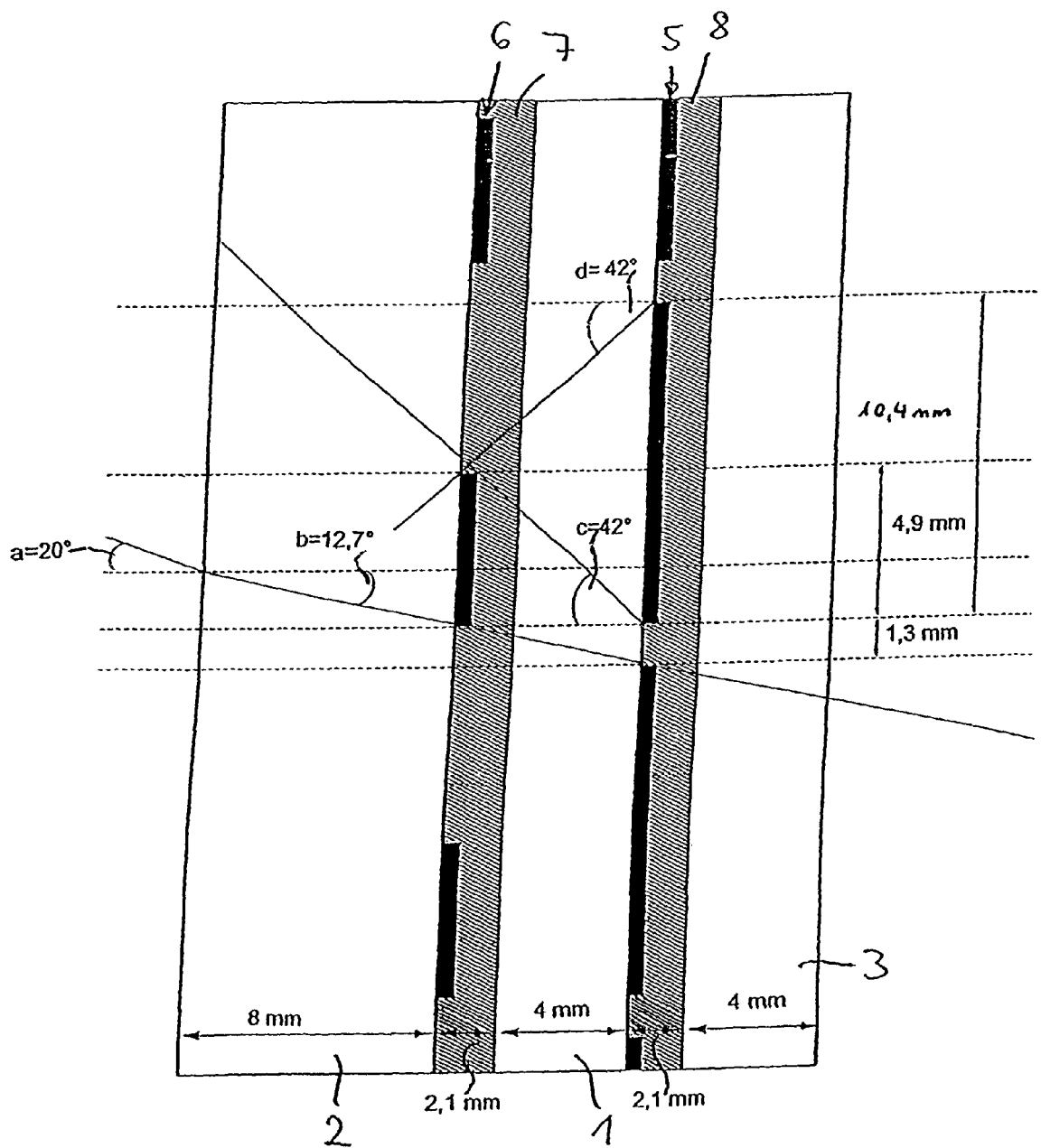
FIG. 3 a second example for an embodiment of the sun protection device.

FIG. 3 shows a further example of a possible embodiment of the present solar protection device. In contrast with FIGS. 1 and 2 a further optically transparent layer sequence is provided on the inside with this embodiment. This third transparent layer sequence in the present example consists of a glass pane 3 and an adhesive film 8, for example of PVB. FIG. 3 thus shows a 3-way composite glass pane in which the structural layers 5, 6 are completely enclosed.

In the example of FIG. 3 the optimal shape of the structures or strips was dimensioned for the case of glass panes with n=1.5 as optically transparent layers. The exemplary dimensions and angles can be taken from the Figure. In the case of another thickness of the middle glass pane 1 the height and the distance of the strips 12, 13 changes accordingly. The angles remain the same.

Figure 4:
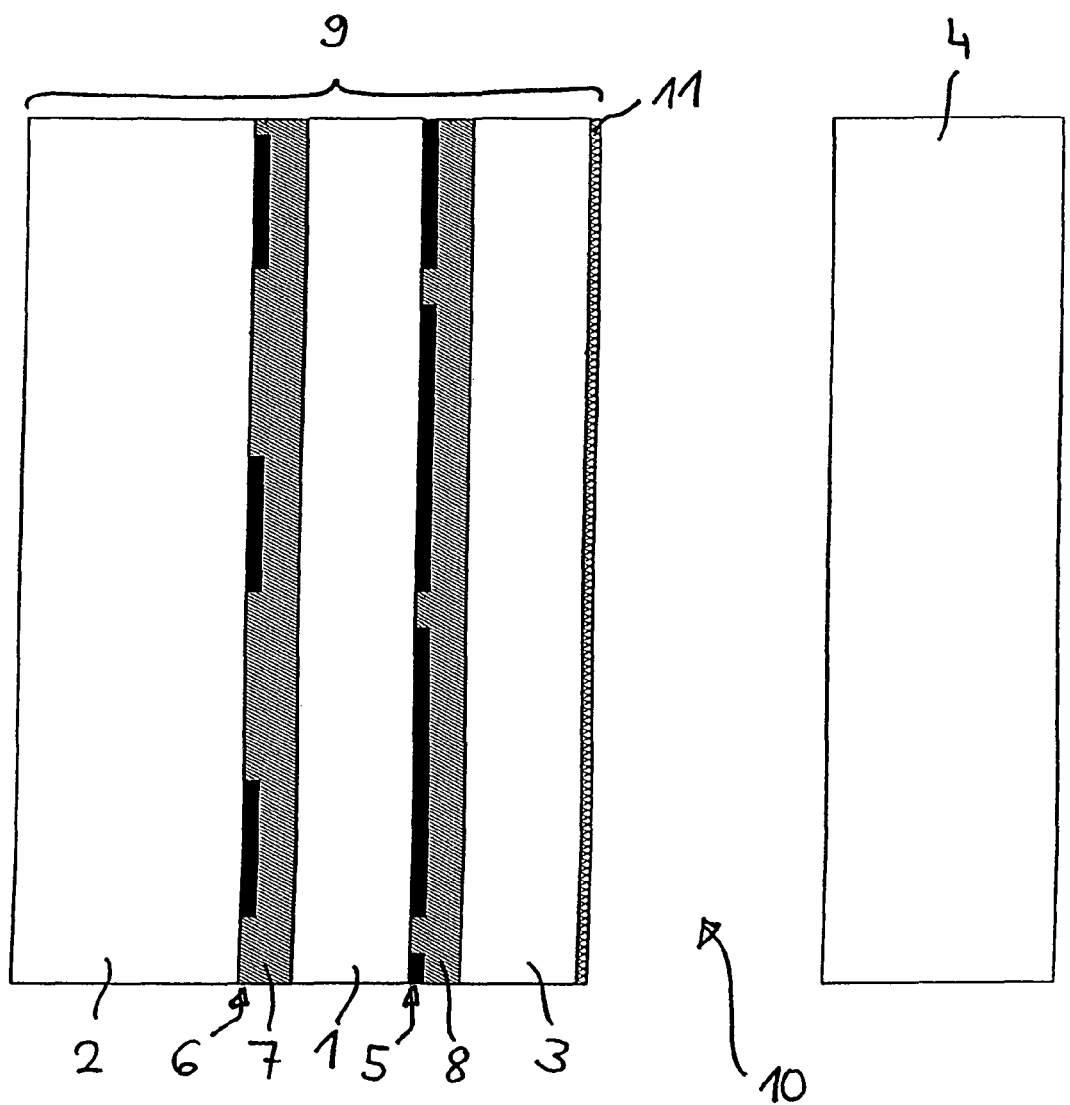
FIG. 4 a third device for an embodiment of the sun protection device.
Figure 5:
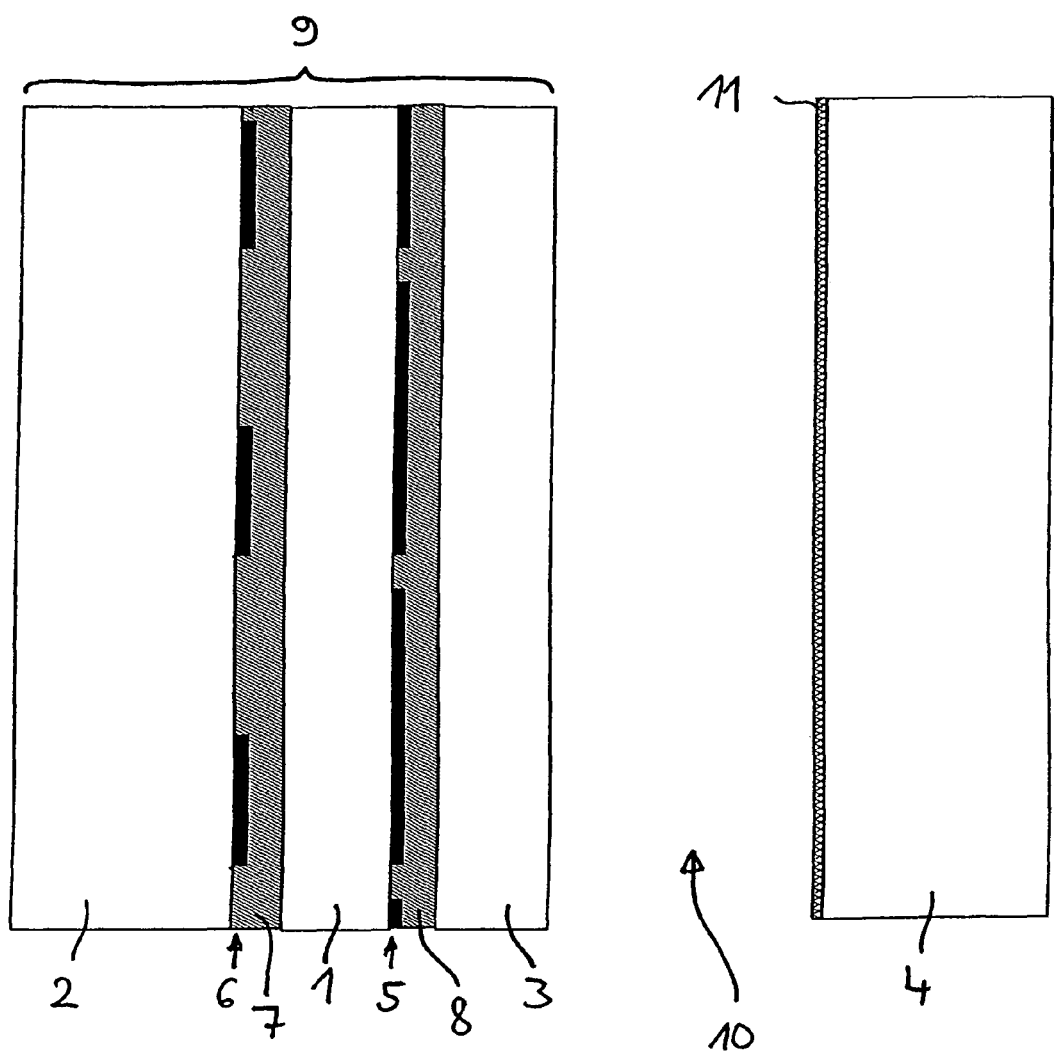
FIG. 5 a fourth example of an embodiment of the sun protection device.

FIGS. 4 and 5 exclusively show possible embodiments of the sun protection device wherein the latter is inserted in a double glazing. To this end, the layer sequence with the transparent layers or panes 1 to 3 and the structural layers 5 and 6 forms an outer glazing element 9 of the double glazing. Between the inner glazing element 4, a glass pane, and the outer glazing element 9 a hermetically sealed intermediate space 10 is formed, which for example can have a thickness of 16 mm and be filled with argon. In the example of FIG. 4 the inside of the outer glazing element 9 is provided with an additional coating 11, for example with a thermal protection coating (e.g. Low-E soft coating).

The embodiment of FIG. 5 in contrast shows the same construction of the double glazing, wherein here however the coating 11 is provided on the outside of the second, inner glazing element 4. This arrangement of the coating 11 can be realised more cost-effectively since the application onto conventional glass panes constitutes a standard process. During subsequent lamination, as is required for the outer glazing element, there is a risk of damaging the coating. A coating subsequently applied to the exterior of the glazing element in turn requires a special process for the specially manufactured outer glazing elements and is thus not available as cost-effectively as a conventional glass pane with this coating.

Figure 6:
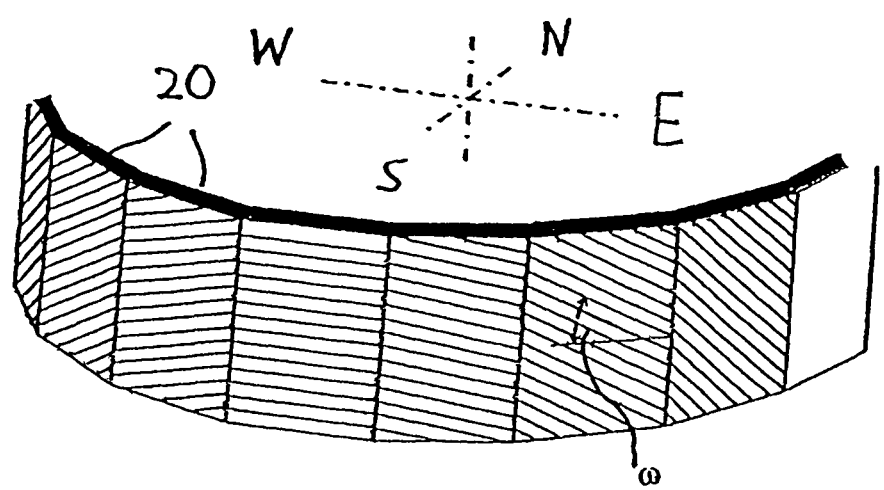
FIG. 6 an example of different orientations of the strips of the sun protection device with different orientation of the facade.

On facades which are not orientated to the south the strips 12, 13 of the two structural layers 5, 6 should be turned from the vertical or horizontal as is illustrated by means of FIG. 6 (refer W. Lorenz "The glazing unit for solar control, day lighting and energy conservation", Solar energy Vol. 70 No. 2, PP 109-130, 2001. In this Figure, different facade elements 20 are exemplarily schematically shown next to one another in different orientation with regard to the directions of the compass indicated in the Figure. In the case of facade elements which are not orientated exactly to the south turning of the strips 12, 13 of the structural layers from the vertical or horizontal is preferred, as is schematically evident for the various orientations from FIG. 6.

Preferably the entire sun protection device is embodied so that through-vision from the inside to the outside is made possible under the defined angular ranges, more preferably downwards. However it is also possible to embody one or a plurality of the inner layers translucently rather than transparently. With translucent embodiment the structure then serves only as glare and sun protection. Light can enter from the bottom outside through the element.

LIST OF REFERENCE NUMBERS

1 Glass pane
2 Second transparent layer
3 Glass pane
4 Inner glazing element

5 First structural layer
6 Second structural layer
7 Adhesive film
8 Adhesive film
9 Outer glazing element
10 Intermediate space
11 Coating
12 Strips of the first structural layer
13 Strips of the second structural layer
14 Light passage openings
15 Incident light from above
16 Observer
17 Grazing light incident from below
18 Surface normal
19 Horizontal
20 Facade element

The invention claimed is:

1. A sun protection device comprising a first structural layer of an opaque or only partially translucent material on an optically transparent dielectric layer or layer sequence, and a second structural layer of an opaque or only partially translucent material, wherein the first structural layer and the second structural layer are structured subject to formation of light passage openings or zones and light-impermeable or light-weakening zones, wherein the second structural layer on a side of the optically transparent layer or layer sequence is opposite the first structural layer and is joined with said optically transparent layer or layer sequence, and the first structural layer and the second structural layer are structured in such a manner that under a predetermined first angular range, which is defined in a reference plane orientated perpendicularly to the second structural layer, optical radiation incident on the second structural layer is blocked or weakened based on structural interaction of the first structural layer and the second structural layer and a proportion of optical radiation, which is incident on the second structural layer under a second angular range with respect to the reference plane, can pass the first structural layer and the second structural layer unhindered, wherein the light-impermeable or light-weakening zones of the first structural layer and of the second structural layer each form strips which run parallel relative to one another, said strips of the first structural layer being mutually offset relative to corresponding ones of the strips of the second structural layer, wherein the light-impermeable zones of the second structural layer are formed of solar cells, wherein straight connecting lines between upper edges facing one another of respectively nearest strips of the first structural layer and the second structural layer run in the reference plane starting from the first structural layer at an angle $\alpha$ to a surface normal to the first structural layer and the second structural layer, for which $0°\leq\alpha\leq42°$ applies, wherein straight connecting lines between lower edges facing one another in each case of nearest strips of the first structural layer and the second structural layer in the reference plane starting from the first structural layer run under an angle $\beta$ to a surface normal to the first structural layer and the second structural layer, for which $-10°\leq\beta\leq15°$ applies, and wherein straight connecting lines between upper edges of the strips of the second structural layer and lower edges of the strips of the first structural layer in each case of nearest strips of the first structural layer and the second structural layer run in the reference plane starting from the first structural layer under an angle $\gamma$ to a surface normal to the first structural layer and the second structural layer, for which $\sigma_{limit}\leq\gamma\leq80°$ applies.

2. The sun protection device according to claim 1, wherein the light-impermeable zones of the first structural layer are formed of solar cells.

3. The sun protection device according to claim 1, wherein said solar cells are amorphous solar cells.

4. The sun protection device according to claim 2, wherein said solar cells are amorphous solar cells.

5. The sun protection device according to claim 1 or 2, wherein the second structural layer on a side opposite to the optically transparent layer or layer sequence is joined with a second optically transparent dielectric layer or layer sequence.

6. The sun protection device according to claim 5, wherein the second optically transparent layer or layer sequence comprises a glass or plastic pane.

7. The sun protection device according to claim 6, wherein the second structural layer is applied on the glass or plastic pane.

8. The sun protection device according to claim 6, wherein the optically transparent layer or layer sequence comprises a glass or plastic pane with an adhesive film thereon, via which the glass or plastic pane is securely joined with the second structural layer and the glass or plastic pane of the second optically transparent layer or layer sequence.

9. The sun protection device according to claim 1, wherein the optically transparent layer or layer sequence comprises a glass or plastic pane.

10. The sun protection device according to claim 1, wherein the first structural layer and the second structural layer are structured in such a manner that, in a perpendicular arrangement, incident light from above is blocked or weakened and a proportion of incident light from below can pass therethrough.

11. The sun protection device according to claim 1, wherein the light-impermeable or light-weakening zones of the second structural layer take up a lesser area than the light-impermeable or light-weakening zones of the first structural layer.

12. The sun protection device according to claim 1, wherein the first structural layer on a side opposite the optically transparent layer or layer sequence is joined with a third optically transparent dielectric layer or layer sequence.

13. The sun protection device according to claim 12, wherein the third optically transparent layer or layer sequence comprises a glass or plastic pane which is joined with the first structural layer and the optically transparent layer or layer sequence via an adhesive film.

14. The sun protection device according to claim 1, wherein the first structural layer and the second structural layer with each of the optically transparent layers or layers sequence joined to said first structural layer and the second structural layer form an outer glazing element of a double glazing, wherein between the outer glazing element and an inner glazing element an intermediate space is filled with a gas or a gas mixture.

15. The sun protection device according to claim 14, wherein the inner glazing element is on a side directed towards the intermediate space and is provided with a sun or heat protection coating.

16. The sun protection device according to claim 1, wherein the strips of the first structural layer are applied by screen printing.

17. The sun protection device according to claim 1, wherein the strips of the first structural layer are adhesive strips.

18. The sun protection device according to claim 1, wherein $\alpha$ is $27°\leq\alpha\leq42°$.

19. The sun protection device according to claim 1, wherein $\gamma$ is $\sigma_{limit}\leq\gamma\leq(\sigma_{limit}+20°)$.

20. The sun protection device according to claim 1, wherein $\beta=0°$.

21. The sun protection device according to claim 1, wherein when the sun protection device is in a fixed orientation to a surface normal to horizontal, a distance D between the upper edges and the lower edges in each case of neighboring strips of the first structural layer are selected so that solar radiation from a solar profile angle $\sigma_p$ is $-20°\leq\sigma_p\leq 70°$ is blocked through the structural interaction of the first structural layer and the second structural layer.

22. The sun protection device of claim 21, wherein $\sigma_p$ is $0°\leq\sigma_p\leq 45°$.

23. The sun protection device of claim 21, wherein $\sigma_p$ is $5°\leq\sigma_p\leq 25°$.

24. The sun protection device according to claim 1, wherein the first structural layer and/or the second structural layer is/are formed from a material comprising a light translucence of $\leq 40\%$.

25. The sun protection device of claim 21, wherein the light translucence is $\leq 10\%$.

26. The sun protection device of claim 21, wherein the light translucence is $\leq 3\%$.

27. The sun protection device according to claim 21, wherein the first structural layer or the second structural layer is formed of a material which has a directed diffuse transmission degree which amounts to less than 20% of an entire transmission degree of the material.

28. The sun protection device according to claim 1, wherein the first structural layer or the second structural layer is formed of a material with a switchable transmission degree.

29. The sun protection device according to claim 28, wherein the material with the switchable transmission degree is an electrochromic material or a gasiochromic material.

30. The sun protection device according to claim 1, wherein an inner side of the first structural layer facing the second structural layer is formed in white color, such that the second structural layer is indirectly illuminated by optical radiation incident on said inner side of the first structural layer.

31. The sun protection device according to claim 1, wherein a $\alpha=\sigma_{limit}$ and $\sigma_{limit}$ is the limit angle of the total reflection.

32. The sun protection device according to claim 1, wherein $\gamma=\sigma_{limit}$ and $\sigma_{limit}$ is the limit angle of the total reflection.

* * * * *

UNITED STATES PATENT AND TRADEMARK OFFICE
CERTIFICATE OF CORRECTION

PATENT NO. : 9,051,771 B2
APPLICATION NO. : 12/308989
DATED : June 9, 2015
INVENTOR(S) : Tilmann Kuhn Page 1 of 1

It is certified that error appears in the above-identified patent and that said Letters Patent is hereby corrected as shown below:

IN THE SPECIFICATION:

Column 7, line 12, "angle α" should read -- angle σ --.

IN THE CLAIMS:

Column 11, line 8, claim 21, "$\sigma_p$ is $-20° \leq \sigma_p \leq 70°$" should read -- $\sigma_p$ is $-20° \leq \sigma_p \leq 70°$ --.

Signed and Sealed this
Fifth Day of April, 2016

Michelle K. Lee
*Director of the United States Patent and Trademark Office*